(12) United States Patent
Sanada et al.

(10) Patent No.: US 7,699,020 B2
(45) Date of Patent: Apr. 20, 2010

(54) METHOD AND DEVICE FOR APPLYING CONDUCTIVE PASTE

(75) Inventors: Yukio Sanada, Fukui (JP); Takeshi Ohkura, Takefu (JP); Hirokazu Naito, Takefu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 1583 days.

(21) Appl. No.: 10/927,321

(22) Filed: Aug. 27, 2004

(65) Prior Publication Data

US 2005/0089628 A1   Apr. 28, 2005

(30) Foreign Application Priority Data

Oct. 23, 2003   (JP) .............................. 2003-363760

(51) Int. Cl.
*B05C 13/00* (2006.01)

(52) U.S. Cl. ....................................... 118/500; 118/503

(58) Field of Classification Search .................. 118/423, 118/500, 503; 414/331.14, 331.16
See application file for complete search history.

(56) References Cited

FOREIGN PATENT DOCUMENTS

| JP | 05-182879 |   | 7/1993 |
|----|-----------|---|--------|
| JP | 6-77098   |   | 3/1994 |
| JP | 8-55764   | * | 2/1996 |
| JP | HEI 09-022851 |   | 1/1997 |
| JP | HEI 09-022854 |   | 1/1997 |
| JP | 2001-093777 |   | 4/2001 |

* cited by examiner

*Primary Examiner*—Brenda A Lamb
(74) *Attorney, Agent, or Firm*—Dickstein Shapiro LLP

(57) ABSTRACT

A tabular holding jig has a plurality of holding holes whose side walls are made from an elastic material. When electronic parts are inserted into the holding holes of the holding jig, deflection of the holding jig is prevented by (a) disposing an intermediate plate between the holding jig and a base plate, or (b) using a base plate having a stepped portion with a raised surface that covers an area of the holding jig where the plurality of holding holes is formed.

12 Claims, 10 Drawing Sheets

METHOD AND DEVICE FOR APPLYING CONDUCTIVE PASTE

BACKGROUND OF THE INVENTION

1. Field of the Invention

The present invention relates to a method for applying a conductive paste to electronic parts and a device for applying conductive paste used in the method.

2. Description of the Related Art

In a fabrication process of an electronic component, such as a laminated ceramic chip capacitor for example, a method has been widely used in which a conductive paste is applied to the electronic parts and is then cured in order to form external electrodes on electronic parts.

To apply the conductive paste for external electrode formation to the electronic parts, a tabular holding jig 51, shown in FIG. 1, and a guide plate 61, shown in FIGS. 2 and 11, are typically used to cause conductive paste 60 to stick to electronic parts 55, as shown in FIG. 4. As shown in FIG. 1, the holding jig 51 is made from an elastic material (such as rubber) 57, which covers metal core materials 56, shown in FIGS. 2 and 3, and has a plurality of holding holes 52 whose side wall is composed of the elastic material (rubber) 57. On the periphery of the holding jig 51, a reinforcing metal frame 58 is attached. As shown in FIGS. 2-4, the holding jig 51 holds electronic parts 55 by using a guide plate 61, and then dips ends of the electronic parts 55 protruding from holding holes 52 of the holding jig 51 into the conductive paste 60 formed on a surface plate 54.

In this method, as shown in FIGS. 1 to 3, the guide plate 61 is aligned with the holding jig 51 such that the center axes of the through-holes 62 are respectively aligned with the center axes of the holding holes 52. The through-holes 62 of the guide plate 61 accommodate the electronic parts 55. With center axes of a plurality of press pins P aligned with the center axes of the holding holes 52, these press pins P simultaneously push the electronic parts 55 held in the through-holes 62 of the guide plate 61 into the holding holes 52 of the holding jig 51, one side of which is in contact with a base plate 53 covering the entire area defined by the outer periphery of frame 58. After the holding jig 51 holds the electronic parts 55, the conductive paste 60 held on the surface plate 54 sticks to the ends of the electronic parts 55 which protrude from the holding holes 52 of the holding jig 51, as shown in FIG. 4.

However, this method causes elastic deformation of the elastic material (rubber) 57 of the holding jig 51 due to pushing pressure when the plurality of press pins P push the electronic parts 55 into the holding holes 52 of the holding jig 51. In particular, the center portion of the holding jig 51 is compressed and, thus, the holding holes 52 generate an inward pressing force. Therefore, the electronic parts 55 are not inserted deeply. In addition, since the entire holding jig 51 is deformed to be convex upward, the protrusion distances (protrusion heights) of the electronic parts 55 from the holding holes 52 in the center portion disadvantageously become longer.

With such unequal protrusion distances, the electronic parts 55 having a long protrusion distance press the conductive paste 60 more strongly that those having a short protrusion distance when the electronic parts 55 are dipped in the conductive paste 60 on the surface plate 54, thus strongly pushing the conductive paste 60 in the transverse direction. Accordingly, when the electronic parts 55 are pulled up from the conductive paste 60, only a small amount of the conductive paste 60 flows in between the electronic parts 55 and the surface plate 54, and therefore, the thicknesses of the conductive paste 60 applied to the ends of the electronic parts 55 disadvantageously become thinner.

To solve these problems, as shown in FIG. 5, the guide plate 61 is aligned with the holding jig 51 underneath the guide plate 61 such that the center axes of the through-holes 62 of the guide plate 61 are aligned with the center axes of holding holes 52 of the holding jig 51. The through-holes 62 accommodate the electronic parts 55. With the center axis of a press pin P aligned with the center axis of the holding hole 52, the press pin P pushes up one of the electronic parts 55 held in the corresponding through-hole 62 into the holding hole 52. Upon completion of the insertion, the press pin P moves to the center of the adjacent holding hole 52 (i.e. the center of the adjacent through-hole 62) and pushes up another electronic part 55 in the same manner. This operation is repeated until all the electronic parts 55 are inserted into the holding holes 52 (refer to, for example, Japanese Unexamined Patent Application Publication No. 9-22854).

Since the insertions of the electronic parts 55 into the holding holes 52 of the holding jig 51 are performed for each holding hole one at a time in this method, the holding jig 51 receives a smaller stress compared to the known method in which all the insertions into the holding holes 52 are simultaneously performed. Accordingly, curvature deformation of the holding jig 51 when holding the electronic parts 55 can be decreased.

However, this method increases the time for holding a large number of electronic parts and, thus, the productivity is disadvantageously decreased.

Another method for a holding jig to hold electronic parts has been proposed in which the conductive paste can be uniformly applied to the electronic parts even when the protrusion distances of the electronic parts from the holding jig are unequal (refer to, for example, Japanese Unexamined Patent Application Publication No. 5-182879).

In this method, as shown in FIGS. 6A to 6D, when ends of the electronic parts 55 are held by the holding holes 52 of the holding jig 51 and the protrusion distances of the electronic parts 55 from the holding holes 52 are unequal, as shown in FIG. 6A, the other ends of the electronic parts 55 protruding from the holding holes 52 are urged onto the surface plate 54, with the holding jig 51 parallel to and distant from a flat surface of the surface plate 54 as shown in FIG. 6B, to align the protrusion distances. That is, since parts of the elastic material 57 around the holding holes 52 simultaneously receive a uniform elastic strain, the protrusion distances become substantially equal and, thus, vertical positions of the electronic parts 55 are aligned, as shown in FIG. 6B.

Thereafter, as shown in FIG. 6D, the ends of the electronic parts 55 protruding from the holding holes 52 of the holding jig 51 are dipped into the conductive paste 60, shown in FIG. 6C, which is developed in a predetermined thickness on the surface plate 54. Thus, the conductive paste 60 is applied to the ends of the electronic parts 55.

However, since the ends of the electronic parts 55 protruding from the holding holes 52 are urged onto the surface plate 54 with the holding jig 51 parallel to a flat surface of the surface plate 54 as shown in FIG. 6B to align the protrusion distances in this method, an extra step is required and, therefore, the fabrication process is disadvantageously complicated and costly.

Also, since this method still causes the elastic deformation of the elastic material (rubber) 57, the protrusion distances cannot be exactly equal, which is a problem.

SUMMARY OF THE INVENTION

In order to overcome the problems described above, preferred embodiments of the present invention provide a method and a device for applying a conductive paste to electronic parts in which, when a holding jig holds the electronic parts, the conductive paste is applied to the electronic parts in predetermined thicknesses at predetermined positions with high precision without sacrificing the productivity by decreasing the variance in protrusion distances of the electronic parts from holding holes of a holding jig.

According to an aspect of the present invention, the method for applying the conductive paste uses a tabular holding jig and a base plate. The holding jig has a plurality of holding holes whose side walls are made from an elastic material. The method includes a step of inserting electronic parts into the holding holes such that the holding jig holds the electronic parts, and a step of dipping ends of the electronic parts protruding from the holding holes into the conductive paste for electrode formation to apply the conductive paste to the ends of the electronic parts. In the inserting step, (a) a flat intermediate plate is disposed between the holding jig and the base plate and a surface of the intermediate plate covers a plurality of holding holes, or (b) the base plate has a stepped portion having a raised surface and the raised surface covers a plurality of holding holes.

Preferably, the intermediate plate or the stepped portion is greater than or equal to about 0.15 mm in thickness in the method for applying conductive paste.

Preferably, the intermediate plate or the raised surface of the base plate in the method for applying the conductive paste, has a size in plan such that an outer peripheral edge of the intermediate plate or the raised surface is positioned within an area between the peripheral edge of the area of the holding jig where the plurality of holding holes is formed and an inner peripheral edge of a frame disposed on the periphery of the holding jig.

According to an aspect of the present invention, a device for applying conductive paste includes a tabular holding jig having a plurality of holding holes whose side walls include an elastic material; a base plate functioning as a pressure-receiving unit when electronic parts are inserted into the holding holes; a flat intermediate plate disposed between the holding jig and the base plate, a surface of the intermediate plate covering a plurality of holding holes; inserting means for inserting the electronic parts into the holding holes such that the holding jig holds the electronic parts while the plurality of holding holes is in contact with the intermediate plate; and conductive-paste holding means for holding conductive paste for dipping the electronic parts held by the holding jig.

According to an aspect of the present invention, a device for applying conductive paste includes a tabular holding jig having a plurality of holding holes whose side walls include an elastic material; a base plate functioning as a pressure-receiving unit when electronic parts are inserted into the holding holes, and having a stepped portion having a raised surface that covers a plurality of holding holes; inserting means for inserting the electronic parts into the holding holes such that the holding jig holds the electronic parts while the plurality of holding holes is in contact with the raised surface of the base plate; and conductive-paste holding means (receptacle) for holding the conductive paste for dipping the electronic parts held by the holding.

Preferably, the intermediate plate or the stepped portion is greater than or equal to about 0.15 mm in thickness in the device for applying conductive paste.

Preferably, the intermediate plate or the raised surface of the base plate in the device for applying conductive paste, has a size in plan such that an outer peripheral edge of the intermediate plate or the raised surface is positioned within an area between the peripheral edge of the area of the holding jig where the plurality of holding holes is formed and an inner peripheral edge of a frame disposed on the peripheral edge of the holding jig.

According to the present invention, the method for applying conductive paste uses a tabular holding jig and a base plate. The holding jig has a plurality of holding holes whose side walls are made from an elastic material. The method includes a step of inserting electronic parts into the holding holes and, in this step, (a) a flat intermediate plate is disposed between the holding jig and the base plate and a surface of the intermediate plate to cover a plurality of holding holes, or (b) the base plate has a stepped portion with a raised surface and the raised surface covers the plurality of holding holes. Accordingly, when the electronic parts are inserted into the holding holes of the holding jig, deflection of the holding jig can be prevented. According to a conductive paste applying method of the present invention, the variance in protrusion distances of the electronic parts from holding holes of a holding jig is decreased, and therefore, the conductive paste can be applied to the electronic parts in predetermined thicknesses at predetermined positions without the need for a complicated step that decreases the productivity.

In the present invention, the intermediate plate is preferably a rigid plate, such as a metal plate.

Additionally, the holding holes formed in the holding jig may be through-holes, or may be blind holes.

In the method for applying conductive paste, the intermediate plate or the stepped portion is preferably greater than or equal to about 0.15 mm in thickness. Accordingly, the deflection of the holding jig can be reliably prevented in the step in which electronic parts are inserted into the holding holes of the holding jig, and, thus, the present invention can provide the intended effect.

In the method for applying conductive paste, the intermediate plate or the raised surface of the base plate preferably has a size in plan such that an outer peripheral edge of the intermediate plate or the raised surface is positioned within an area between the peripheral edge of the area of the holding jig where the plurality of holding holes is formed and an inner peripheral edge of a frame disposed on the periphery of the holding jig. Accordingly, the deflection of the holding jig that influences on the protrusion distances of the electronic parts can be prevented and the electronic parts can be more reliably held without an occurrence of unequal protrusion distances, thus, the reliability can be increased.

The intermediate plate or the raised surface of the base plate in the present invention has a size in plan such that an outer peripheral edge of the intermediate plate or the raised surface is positioned within an area (predetermined area) between the peripheral edge of the area of the holding jig where the plurality of holding holes is formed and an inner peripheral edge of a frame disposed on the periphery of the holding jig. What that means is that the outer peripheral edge of the raised surface of the intermediate plate or the raised surface is between the boundaries that separate the inside from the outside of the predetermined area i.e., (the boundaries themselves are not included).

According to the present invention, as described above, the device for applying conductive paste includes a tabular holding jig having a plurality of holding holes whose side walls include an elastic material; a base plate functioning as a pressure-receiving unit when electronic parts are inserted into the holding holes; a flat intermediate plate disposed between the holding jig and the base plate, a surface of the intermediate plate covering the plurality of holding holes; an inserter for inserting the electronic parts into the holding holes such that the holding jig holds the electronic parts while the plurality of holding holes is in contact with the intermediate plate; and conductive-paste holding means for holding the conductive paste for dipping the electronic parts held by the holding jig. Therefore, deflection of the holding jig can be reliably prevented in the inserting step in which electronic parts are inserted into the holding holes of the holding jig and, thus, the conductive paste can be applied to the electronic parts in predetermined thicknesses at predetermined positions.

As a result, the conductive paste can be reliably applied as in the above-described conductive-paste applying method by using the conductive-paste applying device according to the present invention. Thus, the conductive paste can be effectively applied to the electronic parts.

The device for applying conductive paste can according to the present invention include a base plate having a stepped portion with a raised surface that covers the plurality of holding holes of the holding jig instead of the intermediate plate. Therefore, deflection of the holding jig can be reliably prevented, in the step in which electronic parts are inserted into the holding holes of the holding jig, as in the conductive-paste applying device using the intermediate plate, and, thus, the conductive paste can be applied to the electronic parts in predetermined thicknesses at predetermined positions.

As a result, the conductive paste can be reliably applied as in the above-described conductive-paste applying method by using the conductive-paste applying device according to the present invention. Thus, the conductive paste can be effectively applied to the electronic parts.

In the device for applying conductive paste, the intermediate plate or the stepped portion is preferably greater than or equal to about 0.15 mm in thickness. Accordingly, deflection of the holding jig can be reliably prevented in the inserting step in which electronic parts are inserted into the holding holes of the holding jig, and, thus, the present invention can provide the intended effect.

In the device for applying conductive paste, the intermediate plate or the raised surface of the base plate preferably has a size in plan such that an outer peripheral edge of the intermediate plate or the raised surface is positioned within an area between the peripheral edge of the area of the holding jig where the plurality of holding holes is formed and an inner peripheral edge of a frame disposed on the peripheral edge of the holding jig. Accordingly, deflection of the holding jig that influences the protrusion distances of the electronic parts can be prevented and the electronic parts can be more reliably held without variation in protrusion distances, thus, the reliability can be increased.

Other features, elements, steps, characteristics and advantages of the present invention will become more apparent from the following detailed description of preferred embodiments with reference to the attached drawings.

DESCRIPTION OF THE PREFERRED EMBODIMENTS

The features of the present invention will be described in more detail through the following embodiments.

First Embodiment

In this embodiment, the following case is described as an example: a conductive paste for external electrode formation is applied to electronic parts to form external electrodes on ceramic parts (the electronic parts), each of which having a plurality of internal electrodes laminated and arranged with ceramic layers therebetween in a fabrication process of an electronic component (a laminated ceramic chip capacitor in this example).

Figure 1:
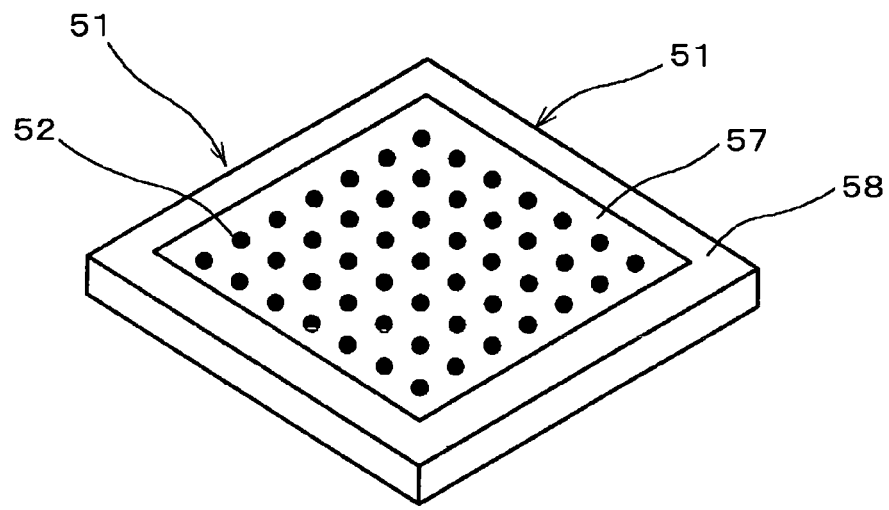
FIG. 1 is a perspective view of a known holding jig for holding electronic parts.
Figure 2:
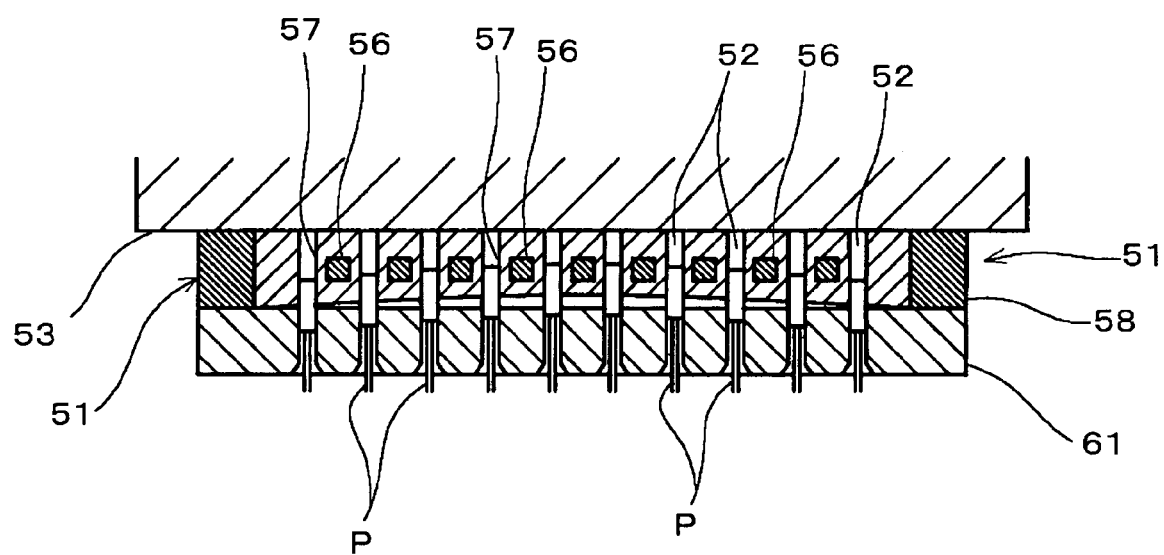
FIG. 2 is a diagram illustrating a step of a known conductive-paste applying method, in which the electronic parts are held in holding holes of the holding jig.
Figure 3:
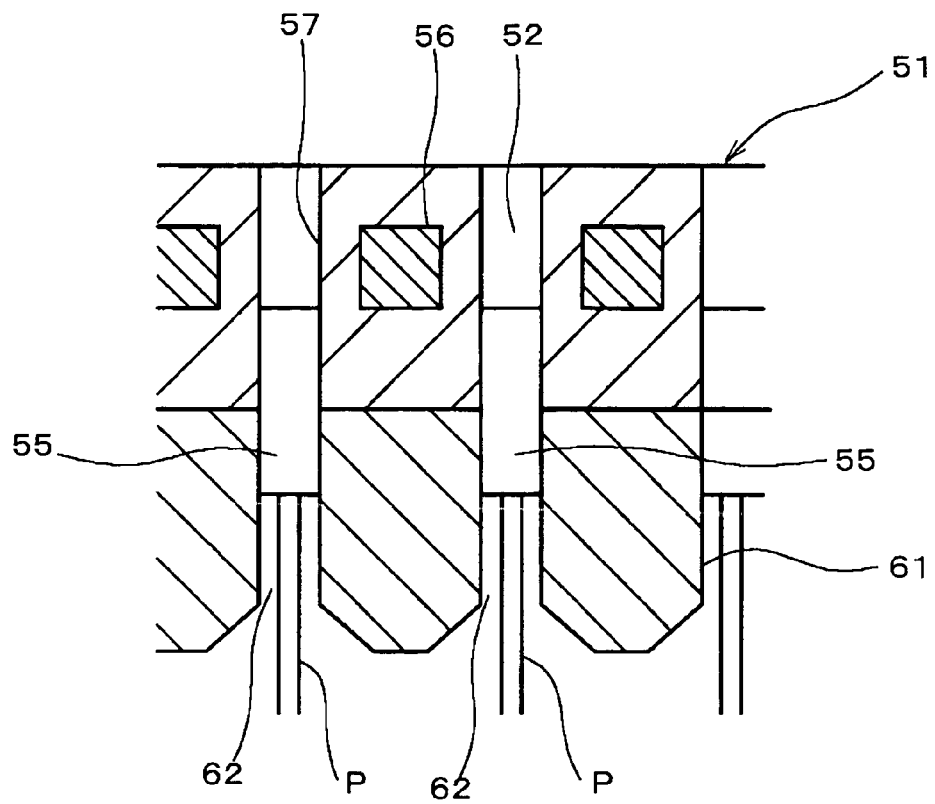
FIG. 3 is an enlarged view of the relevant portion in FIG. 2.
Figure 4:
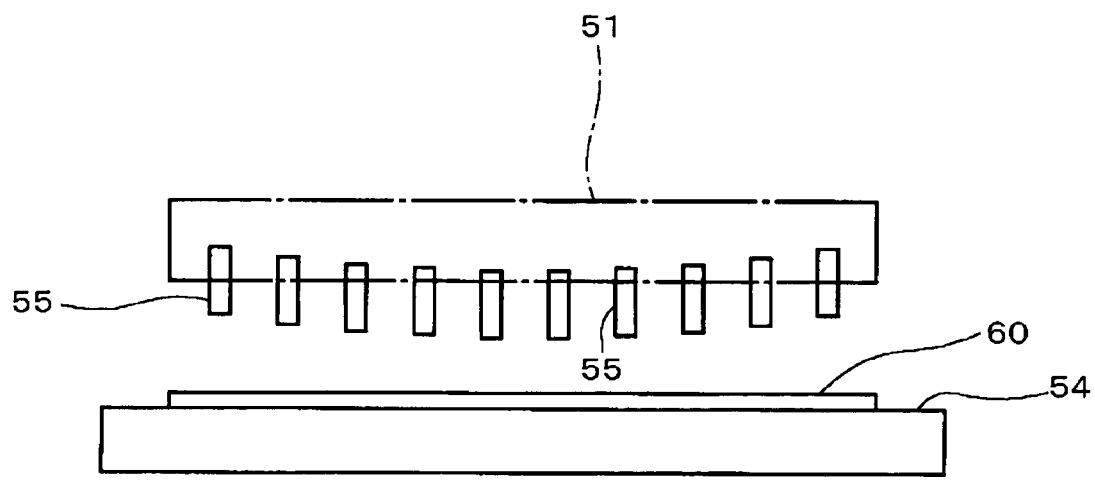
FIG. 4 is a diagram illustrating a step of a known method, in which the electronic parts held by the holding jig are dipped in the conductive paste.
Figure 5:
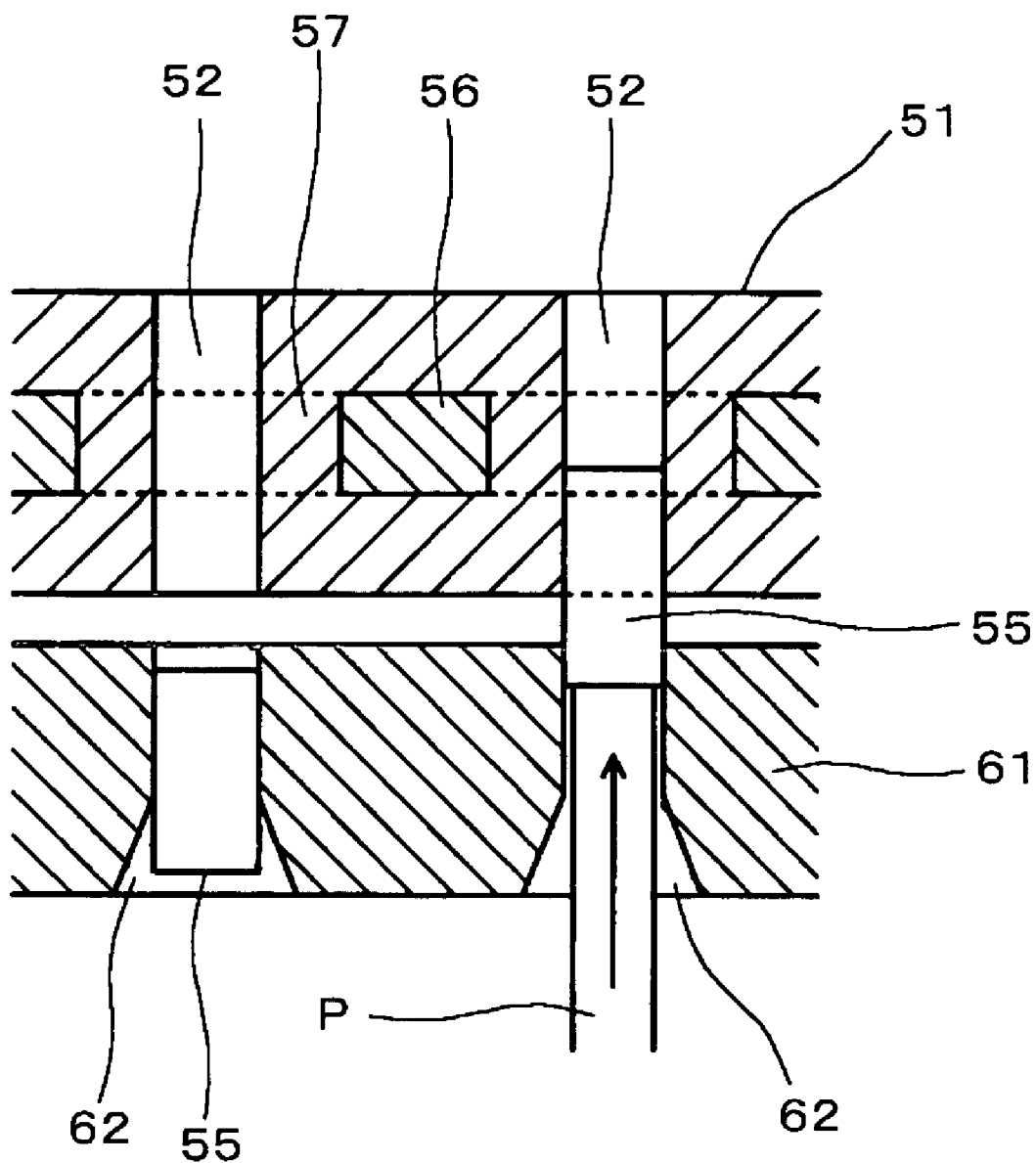
FIG. 5 is a diagram illustrating a known method of a holding jig for holding electronic parts.
Figure 6:
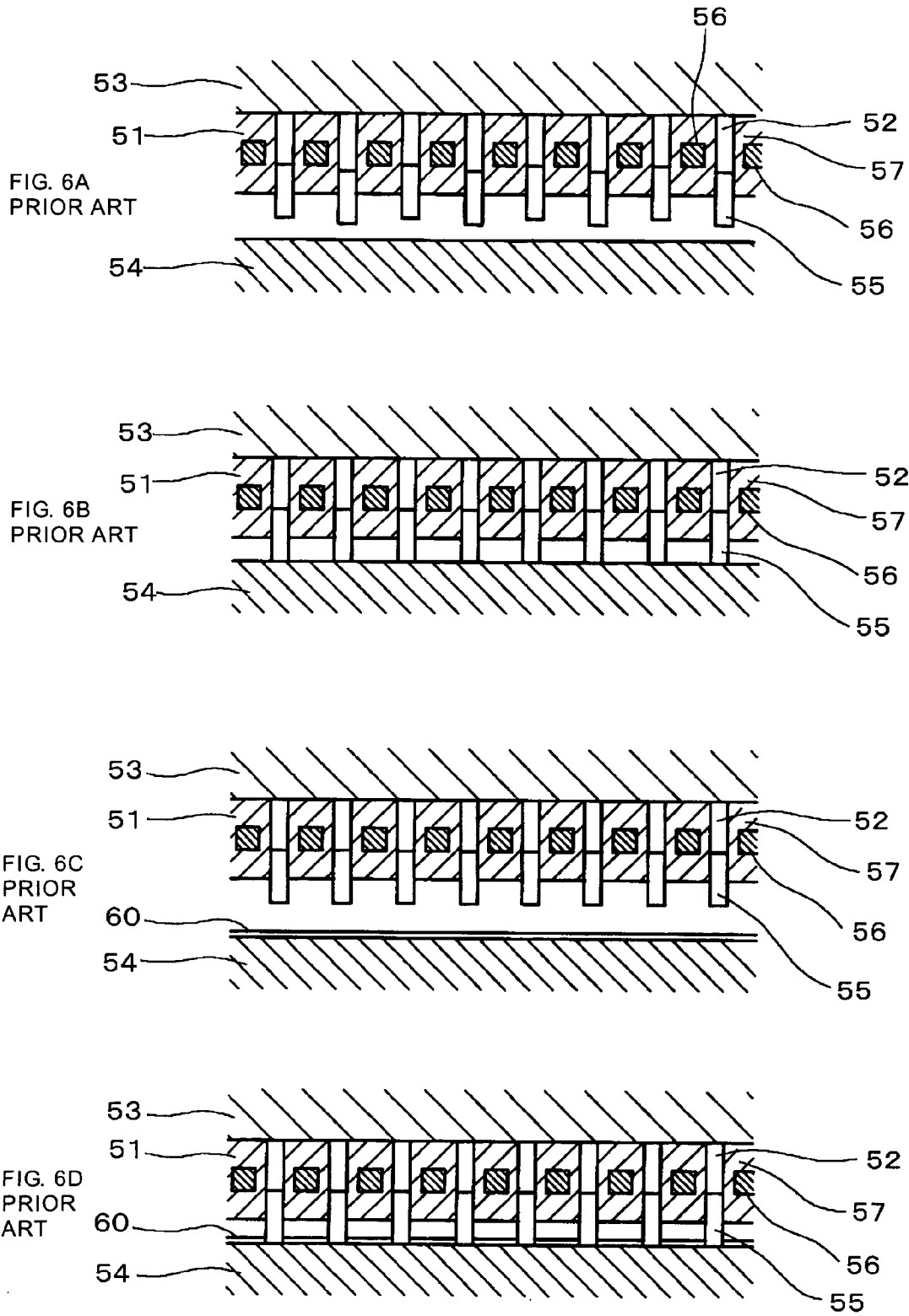
FIGS. 6A, 6B, 6C and 6D are diagrams illustrating another known method of a holding jig for holding electronic parts.
Figure 7:
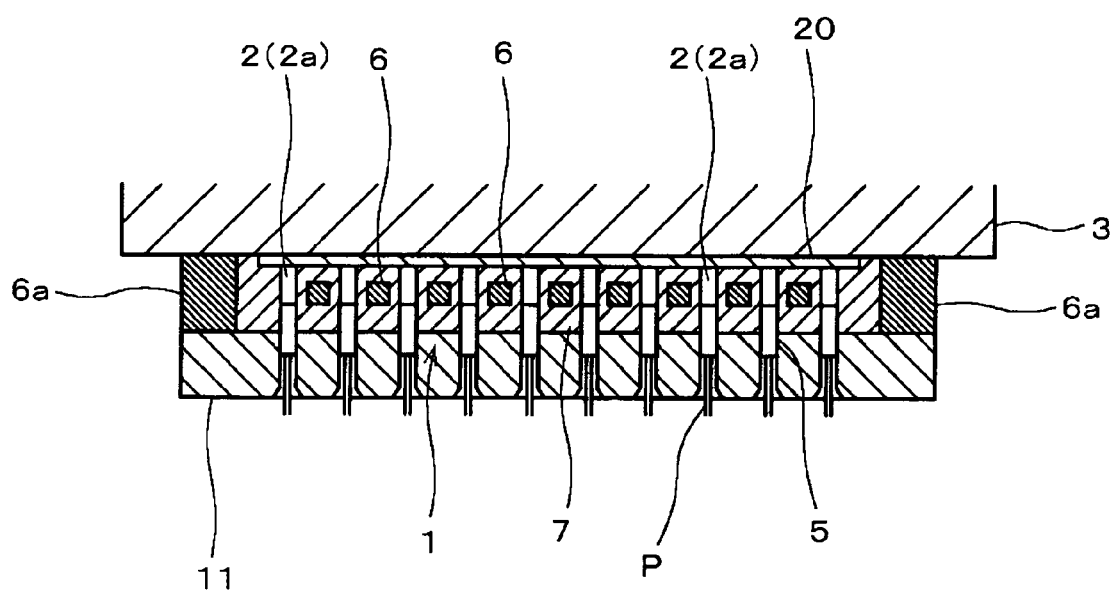
FIG. 7 is a diagram illustrating a method for holding electronic parts in holding holes of a holding jig in a conductive paste applying process according to an embodiment of the present invention.
Figure 8:
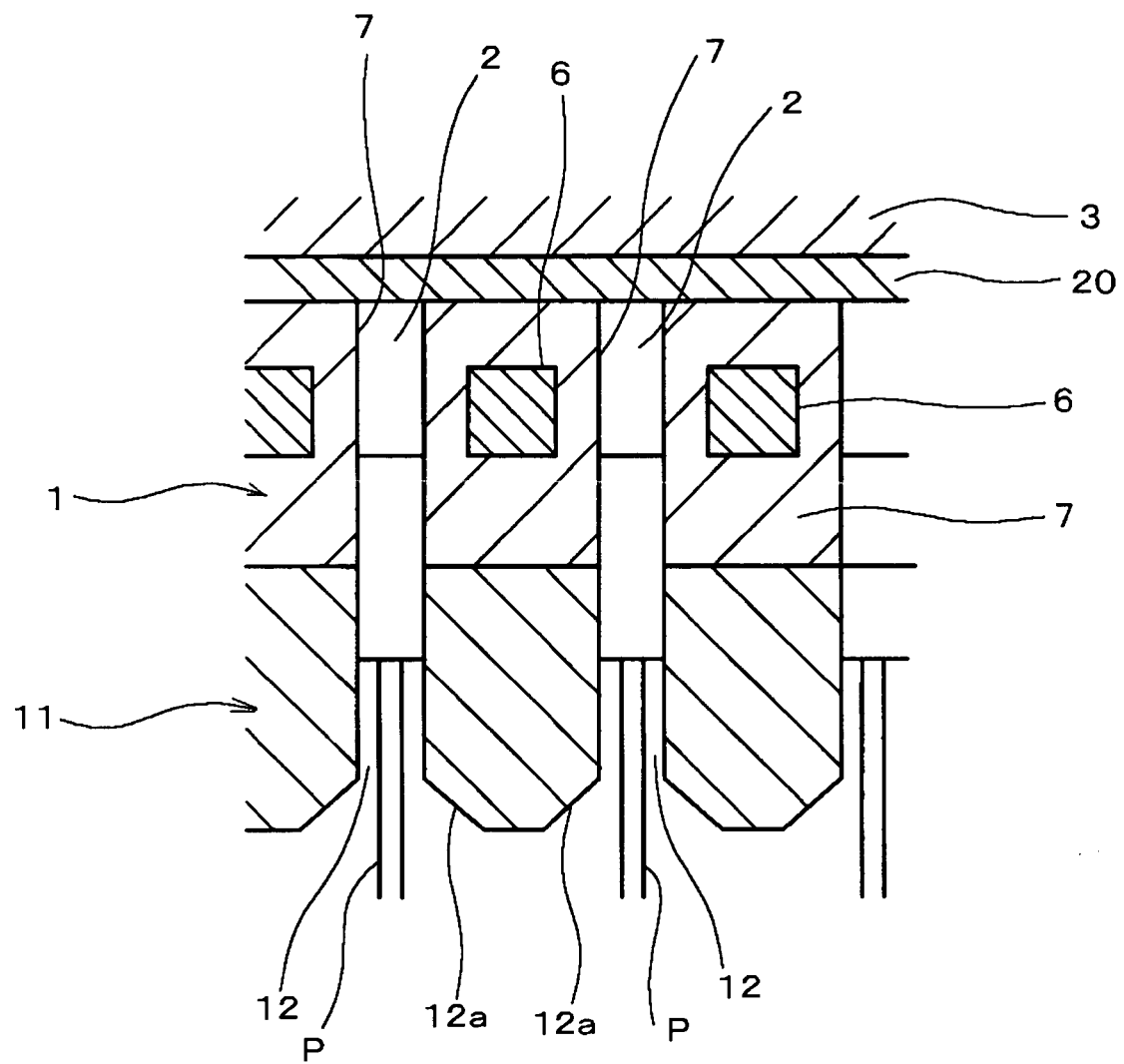
FIG. 8 is an enlarged view of the relevant portion in FIG. 7.
Figure 9:
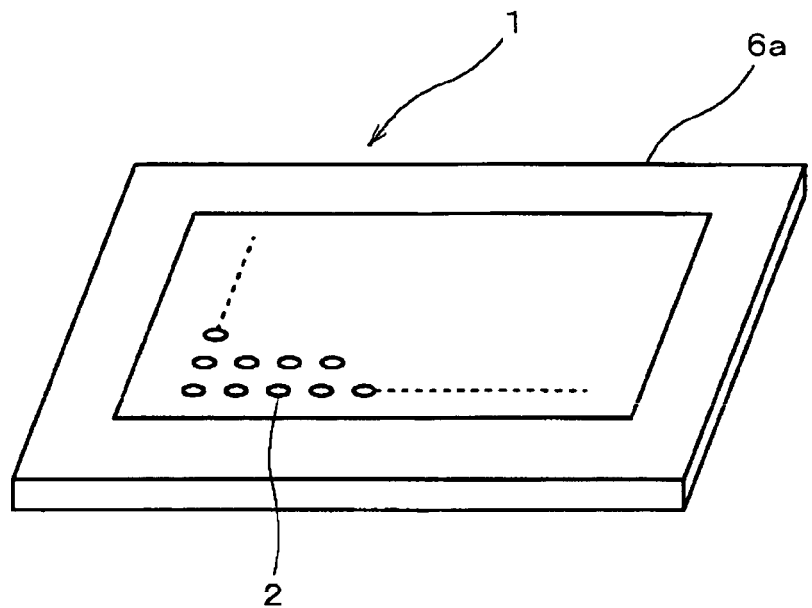
FIG. 9 is a perspective view of the structure of the holding jig used in the conductive paste applying process according to the embodiment of the present invention.

FIG. 7 is a diagram illustrating a method for holding electronic parts in holding holes of a holding jig in a conductive-paste applying process according to the embodiment of the present invention. FIG. 8 is an enlarged view of the relevant portion in FIG. 7. FIG. 9 is a perspective view of the structure of the holding jig.

As shown in FIGS. 7 to 9, in order to hold electronic parts 5 in this embodiment, the holding jig 1 has a plurality of holding holes 2, and a guide plate 11 has a plurality of through-holes 12 to temporarily hold the electronic parts 5.

Additionally, the holding jig 1 has a plurality of metal (aluminum in this case) through-holes 2a, a web (core material) 6, and a reinforcing frame 6a attached to the periphery of the web 6. Inside the frame 6a, an elastic material 7 (silicon rubber in this embodiment) covers the web 6, and a plurality of holding holes 2, whose inner walls are made of the elastic material 7, are formed.

The guide plate 11 has the through-holes 12 arranged in the same pattern of the holding holes 2 of the holding jig 1. The openings of the through-holes 12 on a first surface (a surface on a lower side in an example of FIG. 8) have tapered portions 12a so that the electronic parts 5 can be easily inserted.

Between a base plate (pressure-receiving unit) 3, with which the holding jig 1 is to be in contact, and the holding jig 1, a rigid intermediate plate 20 (a stainless plate in this embodiment) is disposed to prevent deflection of the holding jig 1.

By using the above-described device, a holding method, in which a holding jig holds electronic parts, and an applying method, in which conductive paste is applied to the electronic parts held by the holding jig by dipping the electronic parts into the conductive paste, will be described next.

(1) Firstly, the holding jig 1 is aligned so that the center axes of the through-holes 12 of the guide plate 11 are aligned with the center axes of the holding holes 2 of the holding jig 1.

(2) Secondly, the electronic parts 5 are inserted into the through-holes 12 of the guide plate 11.

(3) Thirdly, while the holding jig 1 is in contact with the base plate (pressure-receiving unit) 3 with the intermediate plate 20 therebetween, a plurality of press pins P, which are parts-insertion means, move to insert the electronic parts 5 accommodated in the through-holes 12 of the guide plate 11 into the respective holding holes 2 of the holding jig 1.

Thus, the plurality of electronic parts 5 are simultaneously inserted into the holding holes 2 of the holding jig 1 and are held.

At this time, since the electronic parts 5 are inserted into the holding holes 2 by the press pins P while one of the surfaces of the holding jig 1 is in contact with the base plate (pressure-receiving unit) 3 with the intermediate plate 20 therebetween, the deflection of the holding jig 1 is prevented, and therefore, the protrusion distances (protrusion heights) of the electronic parts 5 from the holding holes 2 are substantially equal.

Alternatively, the holding jig 1 and the guide plate 11 may be held by, for example, a chuck, and a surface of the holding jig 1 may be in contact with the base plate 3 with the intermediate plate 20 therebetween. Also, the positions shown in FIG. 7 may be turned upside down.

Figure 10:
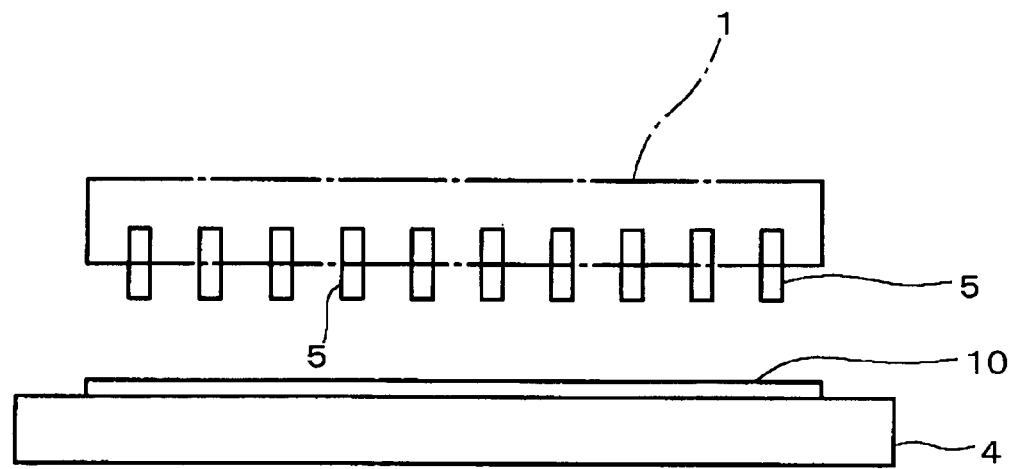
FIG. 10 is a diagram illustrating a dipping process of the electronic parts into the conductive paste in the conductive-paste applying method according to the embodiment of the present invention.

(4) Fourthly, as shown in FIG. 10, the electronic parts 5, whose protrusion distances (protrusion heights) from the holding holes 2 are nearly equal, are dipped into a conductive paste 10 formed on a surface plate 4 by the holding jig 1, and the conductive paste 10 sticks to the electronic parts 5. Thus, variance in applying thicknesses and applying positions are decreased, and therefore, the conductive paste 10 can be applied in predetermined thicknesses at predetermined positions.

The effect of the thickness and the size of the intermediate plate 20 on the protrusion distances (protrusion heights) of the electronic parts 5 held by the holding jig 1 was measured.

Figure 11:
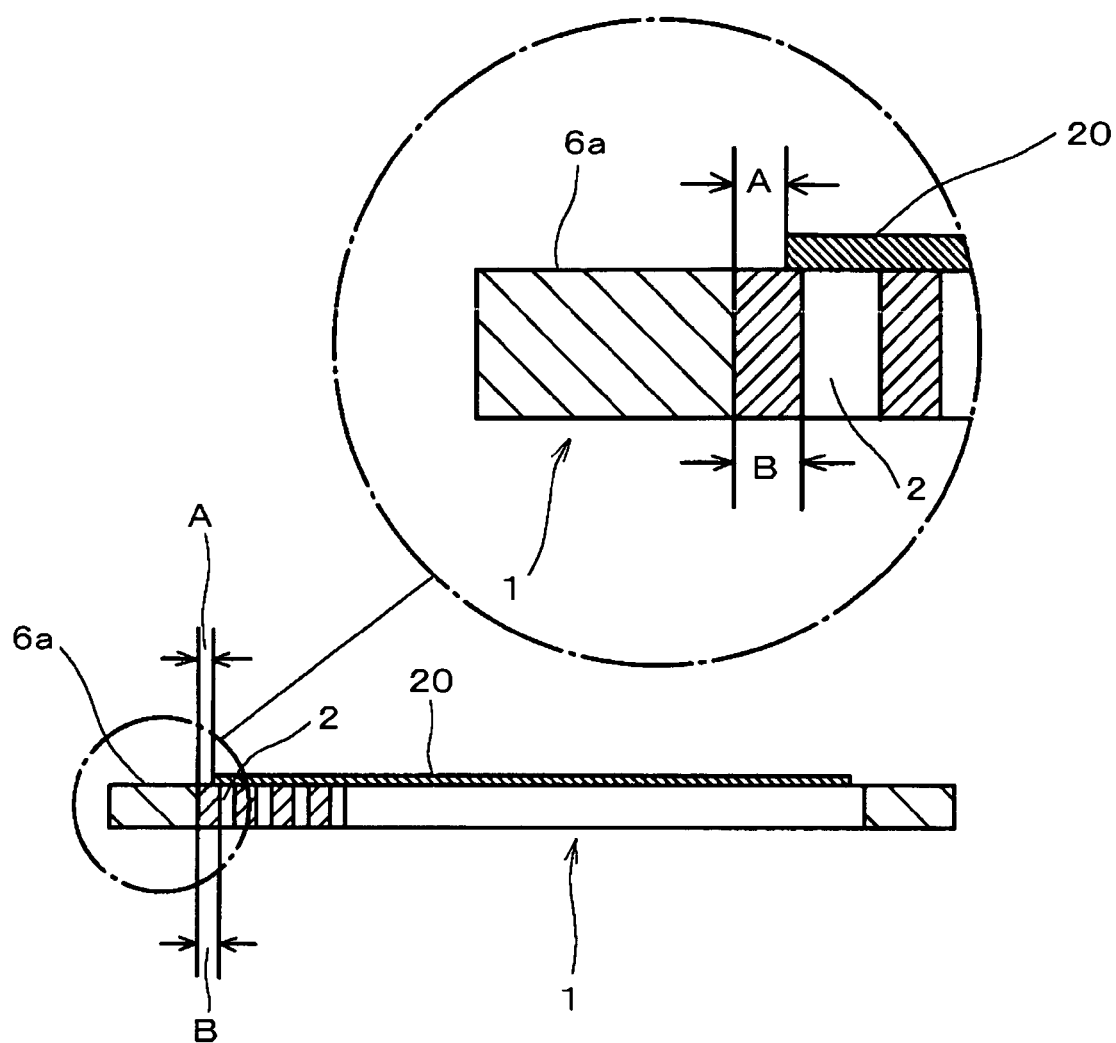
FIG. 11 is a diagram for explaining the size of an intermediate plate used in the conductive-paste applying method according to the embodiment of the present invention.

With reference to FIG. 11, intermediate plates 20 having different distances A between the peripheral edge of the intermediate plate 20 and the peripheral edge of a reinforcing frame 6a were prepared. These distances A were 0 mm, 0.2 mm, 0.5 mm, 1.0 mm, 1.5 mm, 3.0 mm, 3.5 mm and 4.0 mm. Also, intermediate plates 20 having the thicknesses of 1.0 mm, 0.15 mm and 0.12 mm were prepared.

For all the intermediate plates 20, a distance B, shown in FIG. 11, between the peripheral edge of an area where the holding holes 2 of the holding jig 1 are formed and the reinforcing frame 6a disposed on the peripheral edge of the holding jig 1 was a constant value of 4.0 mm.

By using the intermediate plates 20 having the above-described sizes and thicknesses and the above-described method, variance in the protrusion distances from the holding holes was measured.

Figure 12:
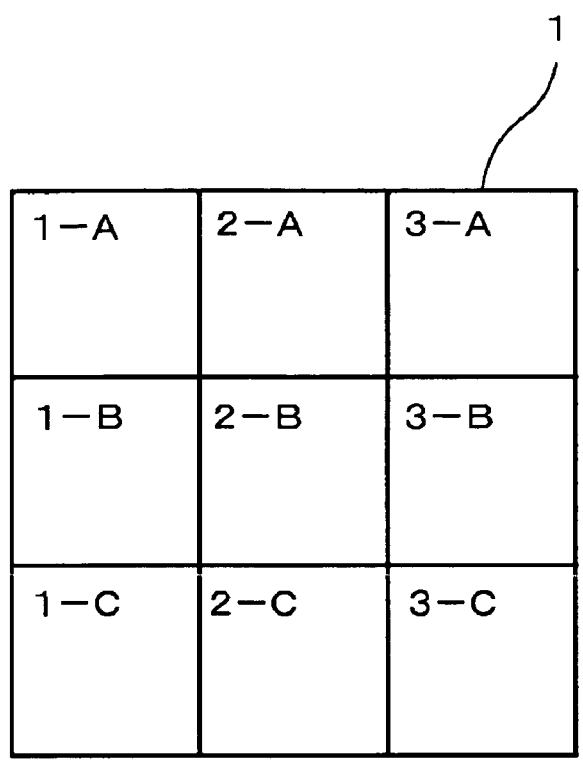
FIG. 12 shows divided areas of the holding jig.

As shown in FIG. 12, the holding jig 1 was divided into nine areas by two equally spaced vertical and horizontal lines. The protrusion distances of the electronic parts in two areas 1-A and 2-B were measured. From the consideration of deflection of the holding jig 1, the area 1-A and areas 3-A, 1-C and 3-C have the same variance and exhibit a maximum variance from the area 2-B.

In contrast, areas 2-A, 1-B, 2-C and 3-B exhibit a medium variance. Accordingly, only comparison between protrusion distances of the electronic parts from the holding holes in the areas where the difference becomes maximum, that is, the areas 1-A and 2-B, was performed. The target value of protrusion distances of the electronic parts from the holding holes was 1.00 mm.

TABLE 1 shows the measurements.

| | | Thickness of insertion plate | | | | | | | | |
|---|---|---|---|---|---|---|---|---|---|---|
| | Distance A between outer peripheral edge of insertion plate and frame | 1.0 (mm) Protrusion heights of electronic parts in areas 1-A and 2-B, and variance in protrusion heights (mm) | | | 0.15 (mm) Protrusion heights of electronic parts in areas 1-A and 2-B, and variance in protrusion heights (mm) | | | 0.12 (mm) Protrusion heights of electronic parts in areas 1-A and 2-B, and variance in protrusion heights (mm) | | |
| Sample number | (mm) | 1-A | 2-B | Variance | 1-A | 2-B | Variance | 1-A | 2-B | Variance |
| 1 | No insertion plate | 1.01 | 1.15 | 0.14 | 1.01 | 1.15 | 0.14 | 1.01 | 1.15 | 0.14 |
| 2 | 0.0 | 0.99 | 1.10 | 0.11 | 1.00 | 1.10 | 0.10 | 1.00 | 1.12 | 0.12 |
| 3 | 0.2 | 0.99 | 1.03 | 0.04 | 1.00 | 1.02 | 0.02 | 1.00 | 1.10 | 0.10 |
| 4 | 0.5 | 1.00 | 1.02 | 0.02 | 0.99 | 1.01 | 0.02 | 0.99 | 1.12 | 0.13 |
| 5 | 1.0 | 1.00 | 1.02 | 0.02 | 1.00 | 1.02 | 0.02 | 1.00 | 1.09 | 0.09 |
| 6 | 1.5 | 1.01 | 1.02 | 0.01 | 1.01 | 1.01 | 0.00 | 1.01 | 1.12 | 0.11 |
| 7 | 3.0 | 1.02 | 1.01 | 0.01 | 1.01 | 1.01 | 0.00 | 1.01 | 1.12 | 0.11 |
| 8 | 3.5 | 1.02 | 1.02 | 0.00 | 1.02 | 1.02 | 0.00 | 1.04 | 1.13 | 0.09 |
| 9 | 4.0 | 1.25 | 1.02 | 0.23 | 1.26 | 1.03 | 0.23 | 1.05 | 1.15 | 0.10 |
| | — | — | — | Average 0.06 | — | — | Average 0.06 | — | — | Average 0.11 |

Table 1 shows that the areas 1-A and 2-B exhibit a large variance in protrusion distances of the electronic parts from the holding holes in the case of an intermediate plate of 0.12 mm in thickness, while in the cases of intermediate plates of 0.15 mm and 1.0 mm in thicknesses, the areas 1-A and 2-B exhibit a small variance in protrusion distances of the electronic parts from the holding holes.

Figure 13:
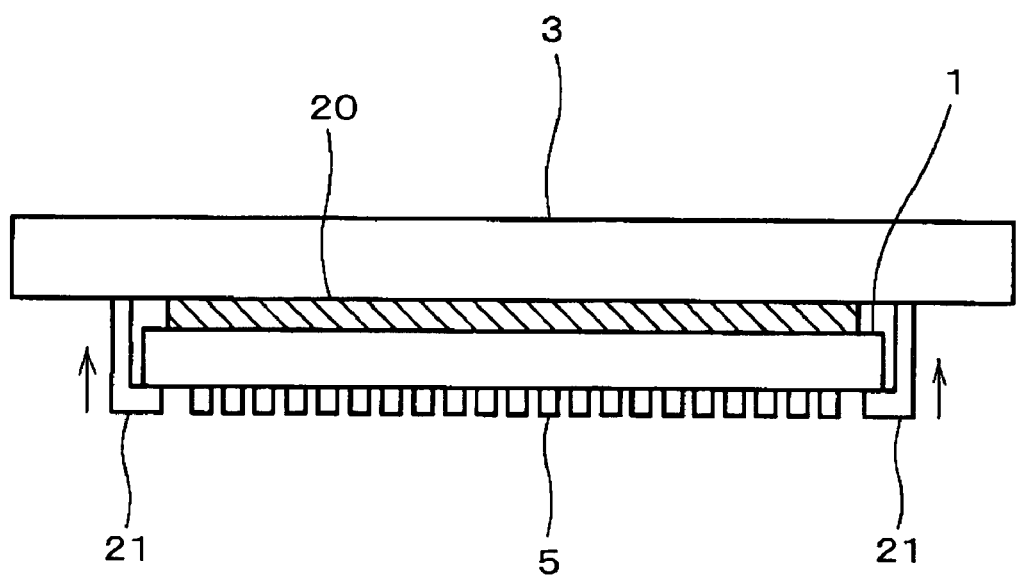
FIG. 13 shows an intermediate plate having a large thickness according to the embodiment of the present invention.

As shown in FIG. 13, a intermediate plate 20 of a large thickness forms a gap between the base plate 3 and the holding jig 1, and a strong holding force of a holding chuck 21 deflects the ends of the holding jig 1. Therefore, the holding force is preferably controlled to an appropriate level.

In terms of the size of the intermediate plate 20, the holding jig 1 used in the above-described experiment had the holding hole 2 at a position 4.0 mm away from the frame (distance B=4 mm), as shown in FIG. 11. Therefore, as can be seen from Sample number 9 in Table 1, the size of the intermediate plate 20 whose peripheral edge overlaps the holding hole 2 (that is, the distance A of 4.0 mm between the peripheral edge of the intermediate plate 20 and the reinforcing frame 6a on the peripheral edge of the holding jig 1) reduces the effect which decreases the variance in protrusion distances of the electronic parts from the holding holes.

Figure 14:
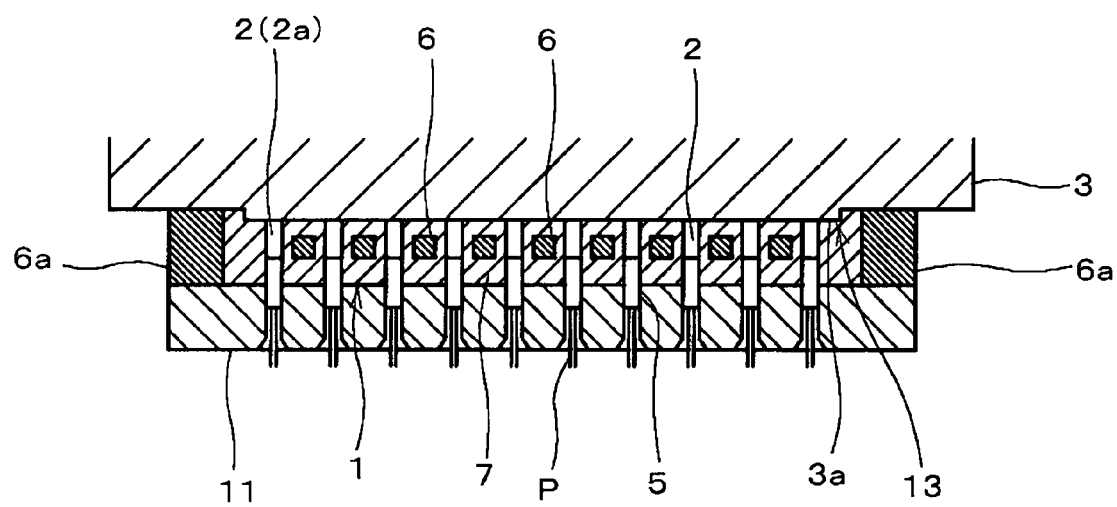
FIG. 14 shows a modification of the embodiment of the present invention.

In the above-described embodiment, the intermediate plate 20 is disposed between the base plate 3, with which the holding jig 1 is to be in contact, and the holding jig 1. However, as shown in FIG. 14, a base plate 3 having a stepped portion (raised area) 13 on its surface may be used. In this case, a raised surface 3a of the stepped portion 13 must be in contact with at least an area of the holding jig 1 where a plurality of the holding holes 2 is formed. This structure can provide the same advantage as described above.

In the above-described embodiment, conductive paste for external electrode formation is applied to the electronic parts in the fabrication process of a laminated ceramic capacitor, in order to form external electrodes on the ceramic parts (electronic parts), However, the present invention can be applied to any type of electronic parts; the present invention can be widely applied to various types of electronic parts when conductive paste is applied thereto.

Furthermore, the present invention is not limited to the above-described embodiments in other areas. For example, various changes and modifications in shapes and structures of the holding jig and the base plate and in shapes and materials of the intermediate plate may be made without departing from the spirit and scope of the invention.

INDUSTRIAL APPLICABILITY

According to the present invention, a tabular holding jig has a plurality of holding holes whose side walls include an elastic material. When electronic parts are inserted into the plurality of holding holes of the holding jig, (a) a flat intermediate plate is disposed between the holding jig and a base plate, or (b) a base plate has a stepped portion with a raised surface which covers the plurality of holding holes. Accordingly, deflection of the holding jig can be prevented in the electronic-parts insertion step. Therefore, the variance in protrusion distances of the electronic parts from the holding holes of the holding jig is decreased, and a conductive paste can be applied to the electronic parts in predetermined thicknesses at predetermined positions without the need for a complicated step that decreases productivity. As a result, the present invention can be widely applied to electronic-component fabrication processes requiring a conductive-paste applying step.

What is claimed is:

1. A device for applying conductive paste comprising:

a tabular holding jig having a plurality of holding holes extending from a first surface to an opposed second surface, the holding holes having side walls comprising an elastic material, and said jig having a peripheral edge;

a plate having a flat surface disposed on the first surface of the holding jig, the flat surface of the plate covering the plurality of holding holes and having an outer peripheral edge which does not extend outward of the peripheral edge of the holding jig;

inserter disposed relative to the second surface of the holding jig and adapted to insert electronic parts into the holding holes such that the holding jig holds the electronic parts while the plurality of holding holes is in contact with the plate; and conductive paste receptacle for holding conductive paste into which the electronic parts held by the holding jig can be inserted;

wherein the plate comprises a base plate functioning as a pressure-receiving unit when electronic parts are inserted into the holding holes, the base plate having a stepped portion having a raised surface, the raised surface being said flat surface covering the plurality of holding holes.

2. The device for applying conductive paste according to claim 1, wherein the stepped portion is greater than or equal to about 0.15 mm in thickness.

3. The device for applying conductive paste according to claim 2, wherein a frame is disposed on the peripheral edge of the holding jig, and the raised flat surface of the base plate has a size in plan such that an outer peripheral edge of the raised surface is positioned within an area between the peripheral edge of the area of the holding jig having the plurality of holding holes and an inner peripheral edge of the frame disposed on the peripheral edge of the holding jig.

4. The device for applying conductive paste according to claim 1, wherein a frame disposed on the peripheral edge of the holding jig, and the raised flat surface of the base plate has a size in plan such that an outer peripheral edge of the raised surface is positioned within an area between the peripheral edge of the area of the holding jig having the plurality of holding holes and an inner peripheral edge of the frame disposed on the peripheral edge of the holding jig.

5. The device for applying conductive paste according to claim 1, wherein the stepped portion of the base plate is greater than or equal to about 0.15 mm in thickness.

6. A device for applying conductive paste comprising:

a tabular holding jig having a plurality of holding holes extending from a first surface to an opposed second surface, the holding holes having side walls comprising an elastic material, and said jig having a peripheral edge;

a plate having a flat surface disposed on the first surface of the holding jig, the flat surface of the plate covering the plurality of holding holes and having an outer peripheral edge which does not extend outward of the peripheral edge of the holding jig;

inserter disposed relative to the second surface of the holding jig and adapted to insert electronic parts into the holding holes such that the holding jig holds the electronic parts while the plurality of holding holes is in contact with the plate; and conductive paste receptacle for holding conductive paste into which the electronic parts held by the holding jig can be inserted;

said device having a base plate functioning as a pressure-receiving unit when electronic parts are inserted into the holding holes, and wherein the plate is disposed between the base plate and the first surface of the holding jig.

7. The device for applying conductive paste according to claim 6,
wherein the plate is greater than or equal to about 0.15 mm in thickness.

8. The device for applying conductive paste according to claim 7,
wherein a frame is disposed on the peripheral edge of the holding jig, and the plate has a size in plan such that an outer peripheral edge of the plate is positioned within an area between the peripheral edge of the area of the holding jig having the plurality of holding holes and an inner peripheral edge of the frame disposed on the peripheral edge of the holding jig.

9. A device for applying conductive paste according to claim 7,
wherein the plate has the outer peripheral edge, a frame having an inner peripheral edge is disposed on the peripheral edge of the holding jig, and the plate has a size in plan such that an the outer peripheral edge of the plate is positioned 0.2-4 mm from the inner peripheral edge of the frame disposed on the peripheral edge of the holding jig.

10. The device for applying conductive paste according to claim 9, wherein the inserter comprises a plurality of push pins.

11. The device for applying conductive paste according to claim 6,
wherein a frame is disposed on the peripheral edge of the holding jig, and the plate has a size in plan such that an outer peripheral edge of the plate is positioned within an area between the peripheral edge of the area of the holding jig having the plurality of holding holes and an inner peripheral edge of the frame disposed on the peripheral edge of the holding jig.

12. The device for applying conductive paste according to claim 11,
wherein the plate is greater than or equal to about 0.15 mm in thickness.

* * * * *